United States Patent [19]

Sachdev et al.

[11] Patent Number: 5,115,090
[45] Date of Patent: May 19, 1992

[54] VISCOSITY STABLE, ESSENTIALLY GEL-FREE POLYAMIC ACID COMPOSITIONS

[76] Inventors: Krishna G. Sachdev, 14 Tanglewood Dr., Wappingers Falls, N.Y. 12590; John P. Hummel, P.O. Box 120, Verbank, N.Y. 12585; Ranee W. Kwong, 31 Mina Dr., Wappingers Falls, N.Y. 12590; Robert N. Lang, R.D. #2, Box 286, North Avenue, Pleasant Valley, N.Y. 12569; Leo L. Linehan, 6 Schofield Pl., Beacon, N.Y. 12508; Harbans S. Sachdev, 14 Tanglewood Dr., Wappingers Falls, N.Y. 12590

[21] Appl. No.: 503,401

[22] Filed: Mar. 30, 1990

[51] Int. Cl.$^5$ .................. C08G 69/26; C08G 69/28
[52] U.S. Cl. .................................. 528/353; 528/351
[58] Field of Search .............................. 528/351, 353

[56] References Cited

U.S. PATENT DOCUMENTS 4,959,437  9/1990  Kunimune ..................... 528/351

FOREIGN PATENT DOCUMENTS 901701  5/1972  Canada ......................... 528/351

*Primary Examiner*—John Kight, III
*Assistant Examiner*—T. Mosley
*Attorney, Agent, or Firm*—John A. Stemwedel

[57] ABSTRACT

Viscosity stable, essentially gel-free linear polyamic acids are provided by a process utilizing offset stoichiometry. Polyimides formed from such polyamic acids have low TCE and low dielectric constants.

Methods for improved adhesion of polyimides are also disclosed.

13 Claims, No Drawings

VISCOSITY STABLE, ESSENTIALLY GEL-FREE POLYAMIC ACID COMPOSITIONS

DESCRIPTION

1. Field of Invention

This invention relates to viscosity stable, essentially gel-free polyamic acid compositions formed by a stoichiometry offset process. The invention also relates to polyimides made from polyamic acid compositions having a low coefficient of thermal expansion and improved thermal, mechanical, and passivation properties.

Additionally, the invention relates to methods for forming multilayer polyimide and metallized structures using polyimide as insulator and passivating layer.

2. Background Art

Polyimides have been materials which have offered potential benefit for passivation and interlayer dielectric in microelectronics since they have long been recognized to offer major advantages in improving the performance characteristics of integrated circuit (IC) devices partly because the organic polymer based insulators have lower dielectric constant compared to the commonly employed inorganic materials. In high density integrated circuits, faster signal propagation and low cross-talk levels are among some of the important considerations and thus polyimide insulators which typically have dielectric constant of 3.5 and which exhibit many excellent thermal and mechanical properties would be preferred over inorganic dielectrics.

However, the conventional polyimides derived from non-linear aromatic diamine and/or dianhydride precursors have relatively high Thermal Coefficients of Expansion (TCE), typically in the range of 30–60 ppm deg$^{-1}$ compared to 2–3 ppm deg$^{-1}$ in the case of inorganic materials (non-metallics) used in devices, substrates or packages such as silicon, ceramic, silicon oxide and silicon nitride, and 6–25 ppm deg$^{-1}$ in the case of commonly employed metallurgy. This TCE mismatch between organic and inorganic materials (i.e., conventional polyimides) in device and packaging multilayer structures results in the development of thermal stresses during high temperature processes in the fabrication cycle which often lead to film cracking/delamination and present a concern as to the performance reliability of end product. Because of such limitations in the use of standard polyimides, there has been a great deal of interest recently in the development of low TCE polyimides for the purpose of generating stress-free multilevel structures in microelectronics among other applications of these materials.

U.S. Pat. No. 3,179,634 is directed to aromatic polyimides and methods for their manufacture. Those polyimides are useful in shaped structures such as self-supporting films, fibers, filaments and the like where outstanding tensile and electric properties and surprising heat and water stability were noted. Offset polymerization to control molecular weight and end capping with a chain terminating agent has been disclosed.

U.S. Pat. No. 3,663,728 discloses improved process for preparing aromatic polyimides using aliphatic polyol solvents. Offset stoichiometry may be used to control molecular weight and polyamic acid polymer viscosity.

U.S. Pat. No. 4,690,999 is directed to certain low thermal expansion polyimides characterized in that there is restricted molecular mobility and in that the polyimide material may be oriented in at least one direction by a uniaxial stretching process. The polyamic acid precursors of these polyimide materials are prepared by a process that leads to the formation of a very high viscosity varnish (gelling) which is heated at 80°–85° C. with stirring until the viscosity of they polyamic acid is reduced to about 50 poises.

Y. Misawea et al,. *IEEE Transaction on Electron Devices*, Vol, ED-34, No. 3, March 1987 is believed to be comparing a low TCE polyimide of U.S. Pat. No. 4,690,999 to "conventional" polyimides in giving the following table:

| Property | Unit | Low TCE-PI (PIQ L100) | Conv-PI (PIQ) |
|---|---|---|---|
| Density | (g/cm$^2$) | 1.47 | 1.38 |
| Coefficient of Thermal Expansion | ($\times 10^{-5}$ K$^{-1}$) | 0.3 | 4.5 |
| Tensile Strength | (Kg/cm) | 39 | 13 |
| Tensile Elongation | (%) | 22 | 30 |
| Young's Modulus | (Kg/cm$^2$) | 1100 | 330 |
| Decomposition Temperature in Air | (°C.) | 510 | 440 |
| Activation Energy of Thermal Decomposition in Air | (kcal/Mol) | 50 | 35 |
| Absorbed Moisture Content | (%) | 1.3 | 2.3 |

It has been recognized in the art that in order to obtain low thermal expansion polyimides, the monomeric starting material (aromatic diamines and aromatic dianhydrides) should have few, if any, flexible linkages, that is be linear materials, in order that the resultant polymer have a rigid rod-like molecular chain structure. It is noted, however, that polyamic acids of very high molecular weight made from the above linear aromatic diamines and dianhydrides are subject to gel formation even at low solids content which makes their use in thin film application impractical. Specifically, it has been observed that condensation polymerization at room temperature using 1:1 stoichiometry of high purity starting materials in the case of 3,3'4,4'-biphenyl tetracarboxylic dianhydride (sBPDA) and p-phenylene diamine (pPDA) in N-methyl-2-pyrrolidone (NMP) solvent results in the formation of polyamic acid as a gel even at a relatively low per cent solids (<10%). When such gelled material is diluted to 5–6% solids so that the resultant polyamic acid solution can be cast into films by spin or spray application, the polyimide films obtained upon curing are of poor quality (micelle formation of gelled material and heterogeneous films and the like). Due to low solids content, these films are relatively thin (<4 μm) even when spun at slow speeds(less than 2000 rpm) and the polyimides formed after curing the films have poor mechanical properties.

SUMMARY OF THE INVENTION

It is an object of the invention to provide polyamic acid compositions having improved storage stability and which are essentially gel-free. The polyamic acid compositions are made by a reaction having offset stoichiometry such that the reactants contain 100 mole parts of a linear aromatic diamine and from 97 to 99.5 mole parts of an aromatic dianhydride.

The invention also provides polyimide compositions which are made by curing the polyamic acid compositions which exhibit improved physical and mechanical properties, including lower moisture absorption and improved performance as insulator and passivation layers in metallurgical structure networks. These properties provide low dielectric constant, low coefficient of thermal expansion, increased elongation, and higher elastic modulus and ultimate tensile strength. It is still a further object of this invention to provide surface activation/modification of a cured polyimide layer for improved adhesion with subsequent polyimide layer, and which provides polyimide-to-polyimide bond durability under multilayer structure fabrication processing and under reliability testing environment including temperature and humidity exposure. Additionally, the invention provides low TCE polyimides for use to passivate metallurgy in IC devices and also to protect/strengthen/passivate other polyimides in the fabrication of multilayer metal structures. Yet another object of this invention is to provide planarized scratch-free polyimide insulator layers by polishing or chemical-mechanical polishing of the low TCE, high modulus, high tensile strength polyimides. The chemical-mechanical polishing techniques for removal of the conductive material overlaying photoresist are known in the art. Chow et al., U.S. Pat. No. 4,702,792, describe simultaneous polishing of photoresist and conductive material which is Al/Cu alloy, using slurry of alumina powder and dilute $HNO_3$ at pH of 3.

DETAILED DESCRIPTION

In accordance with the present invention, viscosity stable essentially gel-free polyamic acid compositions have been prepared which are an offset stoichiometry reaction product of 100 mole parts of a linear aromatic diamine with 97 to 99.5 mole parts of an aromatic dianhydride. After the reaction goes to completion, the resultant polyamic acid composition has residual amine groups present from the excess diamine used in the reaction. These reactive amine groups are quenched or deactivated by the addition of an aromatic anhydride which reacts with these groups to form an amic acid functionality. The capped polyamic acid becomes storage stable having no residual amine reactive sites which would cause any reaction (addition, chain scission, oxidation or other chemical changes) which otherwise would be detrimental to product quality and interfere with the use of the composition to form polyamic acid films for later curing to form the corresponding polyimides. We have found that the polyamic acid properties remain unchanged even after more than one year storage in the refrigerator (<4°-5° C.) and after having been stored at −25° C. for even longer periods. It has been found that polyimide films formed from such aged polyamic acid solutions have properties and performance indistinguishable from polyimides made with freshly synthesized polyamic acid polymers.

It is known in regard to non-linear polyimides (those with TCE of $20-35 \times 10^{-6} K^{-1}$) such as those made from pyromellitic dianhydride and oxydianiline (PMDA-ODA), that the higher the molecular weight, the better the physical and mechanical properties. Attempting to use similar 1:1 stoichiometry with linear-planar monomers to make low TCE polyimides those having rod-like or essentially linear structures resulted in polyamic acids and polyimides which exhibited inferior properties and functional performance.

It has been surprisingly found that the synthesis of 3,3',4,4'-biphenyl-dianhydride-phenylene diamine (sBPDA-pPDA) polyamic acid with a stoichiometry offset such that the sBPDA is present in the range of 97-99.5% of the theoretical amount yields a polyamic acid with superior solution properties and improved film properties of the polyimide formed upon curing. Table I compares the properties of materials made with offset stoichiometry as well as with 1:1 stoichiometry using the same >99% pure starting materials.

TABLE I

BPDA-PDA Polymer Properties as a function of solids content and stoichiometry offset

| Stoichiometry | 1:0.985 | 1:0.991 | 1:1 |
|---|---|---|---|
| A - Polyamic Acid Properties | | | |
| Molecular Weight | 25,000 to 36,000 | 34,000 to 49,000 | 54,000 to 80,000 |
| % solids | 10.5-11.5 | 14.5-15.3 | 6.2 (after dilution) |
| Viscosity (cSt) | 2200-3000 | 32,000-35,000 | 4500 |
| Film Thickness @ 2000 rpm spin for 30 sec. & cure to 400° | 3.5 μm | 12.5 μm | 3.3 μm |
| B - Polyimide Properties | | | |
| Young's modulus (calculated @ 1% strain) | 9-12 GPa | 10-13 GPa | 11-12 GPa |
| Film Thickness used | 8.5 μm (2 coats) | 11-13 μm (1 coat) | 7 μm (2 coats) |
| Ultimate Tensile Strength (UTS) | 500-580 MPa | 500-580 MPa | 406 MPa |
| Elongation-at-Break (Eb, %) | 35-45% | 35-50% | 20% |

*Cross-head speed (strain rate) = 0.5-2 mm/min

Other parameters determined for fully cured BPDA-PDA polyimide prepared according to this invention:

Chemical-mechanical polishing of fully cured BPDA-PDA films on silicon wafers using silica slurry (Cab-O-Sil) showed superior performance of this material in that scratch-free polished surface was obtained in contrast to highly scratched films of flexible chain polyimides such as PMDA-ODA under the same conditions. Furthermore, it is observed that the removal rate of BPDA-PDA is much higher, 2000-5000 Å/min in comparison to less than 1000 Å/min for PMDA-ODA polyimide using about 10-15 psi piston pressure for polishing.

Residual stress in BPDA-PDA polyimide films cured on silicon wafers (measured by the wafer bending technique) was found to be 0 to 1000 psi for BPDA-PDA in comparison to 3000-4000 psi for films of polyimides with non-linear chain segments (due to flexible linkage in the diamine unit) typically, PMDA-ODA, and 5000-6000 psi for polyimide derived from BTDA-ODA, and related polyimides which have flexible linkage both in the diamine and dianhydride used.

Glass Transition temperature >400° C.
Thermal expansion measured by TMA method $$\Delta \alpha = \frac{\Delta L}{L_o \times \Delta T},$$

$\Delta T$ = Change in Temperature
$\Delta L$ = Change in film length within the temperature range
$L_o$ = Initial film length at $T_o$ Average TCE=5-6 ppm/°C. in 75°-125° C. range
Moisture uptake at equilibrium (24 hrs)<0.5% when exposed to ambient humidity (50% RH) at 25° C.; under the same conditions, PMDA-ODA showed 2% $H_2O$ uptake (measured by the Thermogravimetric analysis method)

Dielectric constant as measured by the capacitor technique using Al-Cu/Polyimide insulator/Al-Cu dots: Kirchoff's Law Capacitance $C = E \cdot E_r A/t$ Dielectric Constant $E_r = C/E \cdot \times t/A$ where
E. = permitivity of free space = $10^7/4\pi c^2$
t = insulator thickness;
A = Area of Al/Cu dots When measured according to this method, for BPDA-PDA polyimide, $E_r = 2.9$ at 10 MHz; and 3.0 at 100 KHz dissipation factor = 0.002 under the same conditions, PMDA-ODA derived polyimide has dielectric constant of 3.4–3.5.

Isothermal TGA at 400° C. showed 0.05%/hr steady state weight loss for both BPDA-PDA and PMDA-ODA.

BPDA-PDA showed no swelling in NMP or other processing solvents even on extended exposure.

Synthesis - Methods and Materials

Based on the consideration that polyamic acids made using linear-planar-rigid diamine and dianhydride monomers may be cured to provide low TCE polyimides having rod-like molecular chains with restricted mobility, polyamic acids were synthesized using aromatic diamine monomers selected from the group of p-phenylene diamine (p-PDA), p-diaminobiphenyl (DABP or benzidine), 4,4''-diaminoterphenyl (DATP), and aromatic dianhydrides selected from the group of 1,2,4,5-pyromellitic dianhydride (PMDA), 3,3',4,4'-biphenyl tetracarboxylic acid dianhydride (s-BPDA), and 3,3'-4,4'-benzophenone tetracarboxylic acid dianhydride (BTDA). These polyamic acids were thermally imidized ("cured") to form the corresponding polyimides. Included were PMDA-PDA, PMDA-benzidine, BPDA-PDA, BPDA-benzidine, BPDA-DATP, and PMDA-DATP polyamic acids and polyimides. In each case, high purity starting materials (99+%) were used which were either obtained directly from commercial sources or, when necessary, were purified by crystallization or sublimation. Polyimides derived from benzophenone tetracarboxyllic acid dianhydride (BTDA) and linear diamines were prepared to study the effect on polymer properties when the dianhydride segment has contributory conformations which deviate somewhat from linearity. High purity PMDA (mp 286°–288° C.), BTDA (mp 222°–225°), and zone refined pPDA (mp 141°–143° C.) were used as-received while sBPDA obtained from Chriskev Co. was further purified to give mp 298°–301° C. The as-received benzidine sample was also purified by crystallization and dried under vacuum to give mp 125°–128° C. Polyamic acid intermediates were prepared according to general procedure using anhydrous freshly distilled or as-received highest purity grade (minimum 99.8% purity) N-methyl-2-pyrrolidone (NMP) as solvent. All glassware was oven dried and then allowed to come to room temperature in an inert atmosphere (Argon or N$_2$) before use.

The polyimides prepared from, for example, PMDA-PDA have a linear, rigid-rod type structure being able to rotate around bonds along the molecular axis. These materials exhibit very low TCEs. Polyimides derived from BPDA-PDA exhibit 2 conformations, bent and step with respect to the biphenyl bond. These conformations being linear like provide materials with relatively low TCEs. Polyimides derived from BTDA-PDA and BTDA-benzidine have many degrees of rotational freedom provide non-linear structures with somewhat higher TCEs which are found to be in the 15–22 ppm deg$^{-1}$ range Method of Preparation of Free-Standing Polyimide Films for characterization of mechanical properties and Thermal Expansion studies of polyimides derived from polyamic acids formed by stoichiometry offset Polyimide films used to determine mechanical properties and in-plane TCE were prepared according to the following procedure:

Polyamic acids as-synthesized in NMP were spin coated on silicon wafers with or without a thin silicon oxide layer on silicon. For high viscosity polymer, a single coat at 2000 rpm/45–50 sec was applied and subjected to bake/cure cycle involving 80°–90° C. for 45 min, 140°–150° C. for 45 min, 220°–240° C. for 45 min. all in nitrogen, then 300° C. for 30 min, and 350°–400° C. for 60 min in forming gas. In most cases, films came off readily after the high temperature cure but coatings formed on surface treated (silane adhesion promoter) silicon oxide wafers had to be removed by buffered HF dip which was followed by thorough rinse with deionized water and oven drying of free films at 100° C. before measurements were performed. Typical thickness of cured films under these conditions was 8–12 μm. With the lower viscosity material, 7–8 μm thick films were formed by multiple coatings (two or three) each at spin speed 1500–1700 rpm and in-between bake of 80°–90° C./30 min and 140°–150°/30 min.

EXAMPLE 1

Synthesis of BPDA-PDA Polyamic Acid:

High purity p-phenylenediamine (zone refined), 10.8 g (0.1 mole) was dissolved in 300 g NMP (minimum purity 99.8%) in a three-neck flask equipped with a mechanical stirrer, a thermometer, and a three-way valve for Argon or N$_2$ purge. While the solution was being stirred gently, 28.95 g (0.0985 mole) sBPDA (recrystallized) solids were added in portions at a rate such that the temperature of the reaction mixture was maintained between 25°–31° C. When the addition was complete, stirring was continued for 4–5 hours during which time the temperature decreased to 25° C. and a clear viscous solution was obtained. In order to deactivate the amine end groups remaining due to stoichiometry offset with p-phenylene diamine as excess reagent, 0.37 g of freshly sublimed phthalic anhydride (2.5 mmole was added and stirring was continued for another 4–5 hrs. The polymer solution thus obtained having a viscosity of 2750 centistokes was filtered through 0.2 to 2 μm filter with protection from moisture and transferred to amber glass bottles (or plastic bottles) and stored in refrigerator at less than 4°–5° C. Similar results were obtained using recrystallized and resublimed p-phenylene diamine.

Representative solution properties

Solution viscosity: 2300–2800 centistokes, measured by the Cannon-Fenske routine viscometer method.

Intrinsic viscosity: 1.1–1.5 dl/gm, measured by the Cannon-Ubbelohde viscometer method using four different concentrations: 0.349 mg/ml, 0.878 mg/ml, 1.454 mg/ml, and 2.265 mg/ml.

Properties of Polyimide films

Film thickness: 2-2.5 μm fully cured films formed by spin application on silicon wafers at 3000 rpm/30 sec and baked/cured to 400° C.

Mechanical Properties measured on 6-8 μm thick fully cured films (formed by 2 coats at 2000 rpm spin speed with in-between coats soft bake at 85°/30 min and 130°-140° C./45 min), using standard stress-strain tensile testing method: Elongation-at-break (Eb,%)=35-40% at cross-head speed of 0.5 mm/min (strain rate). Young's modulus at 1% strain=9-11 GPa. Ultimate tensile strength (UTS)=480-550 MPa.

Moisture absorption: <0.5% at equilibrium when exposed to 50% relative humidity at 25%° C. Moisture uptake was measured by monitoring the weight gain in about 10 mg of fully cured films in a TGA pan over 24 hrs at 50% relative humidity.

Dielectric Constant: 2.9 at 10 MHz; 3.0 at 100 KHz

To determine the shelf life of this material under actual use conditions, solution viscosity, film quality and mechanical properties of cured films were monitored during 2-3 weeks storage at 20°-23° C. It was observed that very little change in viscosity (<5%) occurs within 10 days to 2 weeks at room temperature. Evaluation of mechanical properties of polyimide films formed from these aged polyamic solutions showed essentially no difference when compared with films formed with freshly synthesized material.

EXAMPLE 2

High Viscosity s BPDA-PDA Polyamic Acid Formulation For Thicker Films (% solids=15.3 stoichiometry=1:0.991) p-Phenylene diamine of >99% purity (zone-refined or resublimed or recrystallized), 27.0 g (250 mmoles) was dissolved in 550 g (freshly distilled or highest purity commercial grade) NMP in a 1 l three-neck flask equipped with a mechanical stirrer, a thermometer, and a three-way valve for inert gas purge (N₂ or Argon). When the diamine had dissolved completely, sBPDA of >99% purity, 72.84 g (247.75 mmole) was added as solid in portions to the gently stirred solution such that the reaction mixture was maintained at 25°-32° C. After addition was completed (μ45 min.), stirring was continued for 4-5 hrs under N₂ and 0.5 g (3.38 mmole, 74.6% of theory) of freshly sublimed phthalic anhydride was added to cause reaction with available amine-end groups due to excess PDA and stirring was continued for another 5 hours after which the material was stored in tightly-stoppered bottles with protection from moisture. Shelf-life study under actual use conditions showed less than 5% change in solution viscosity upon room temperature storage for 10 days. Film quality, film thickness, and mechanical properties of polyimide films formed from the aged material were indistinguishable from the unaged material.

Representative solution properties

Solution Viscosity=30,000-32,000 cSt, measured as in Example 1.

Intrinsic viscosity=1.1-1.6 dl/gm, measured as in Example 1.

Polyimide Properties

Film thickness: 11-12.5 μm thick films formed on silicon wafers by spin coating @2000 rpm/50 sec and baked/cured up to 350°-400° C.

Mechanical Properties using 11-12 μm thick films:

Young's modulus (Elastic modulus)=9-12 GPa (calculated at 1% strain).

Elongation-at-break (Eb)=35-45% at cross-head speed 0.5-2 mm/min (strain rate).

Ultimate tensile strength (UTS)=480-550 MPa.

Moisture absorption: <0.5% at equilibrium (after 24 hours) upon exposure to 50% RH (relative humidity) measured as in Example 1.

Dielectric constant: 2.9 at 10 MHz; 3.0 at 100 KHz determined according to the capacitance method.

EXAMPLE 3

Synthesis of PMDA-Benzidine Polyamic Acid (% Solids=13.0 Stoichiometry=1:1 and and Stoichiometry 1:0.994)

4,4'-Diamino biphenyl or benzidine (>99% purity), 18.4 g (100 mmole), was dissolved in 250 g NMP and 30 g diglyme (both solvents were of highest purity) in a 500 ml three-neck flask equipped as in Examples 1 and 2. When the diamine had dissolved completely, 21.8 g(100 mmole) of PMDA was added in portions such that the reaction temperature remained between 25°-32° C. At the end of addition, rapid gel formation was observed. Synthesis was repeated using stoichiometry offset with 100 mmoles of benzidine and 99.4 mmoles of dianhydride. All other parameters including solids content and reaction conditions were maintained as described. After addition of PMDA was complete, stirring was continued for 5 hours and then stoichiometric amount of phthalic anhydride was added to react with excess amine end groups. This gave gel free polyamic acid which was cast into films on silicon wafers and baked/cured to 350°-400° C. to form polyimide. These fully cured films were found to be quite brittle. Thermal expansion properties are given in Table 1.

EXAMPLE 4

Synthesis of BPDA-Benzidine Polyamic Acid (% Solids=12.3: Stoichiometry=1:1 and Stoichiometry 1:0.99)

Using the procedure of Example 3, 18.4 g (100 nmoles of 4,4'-diaminobyphenyl was dissolved in a mixture of 320 g NMP and 20 g diaglyme. To this solution 29.4 g (100 mmoles) of BPDA was added and gellation occurred as the reaction proceeded. Using 29.1 g (0.99 mmole) the reaction proceeded to give a gel-free high viscosity polymer. Thermal expansion data and streestrain properties of the polyimide films formed from this polyamic acid are given in Tables 1 and 2. Dielectric constant at 10 MHz=3:1 and at 100 KHz=3.2.

EXAMPLE 5

Synthesis of PMDA-Tetramethyl-benzidine Polyamic acid

% Solids=11.2; Stoichiometry=1:1 and Stoichiometry - 1:0.99).

EXAMPLE 6

Synthesis of BPDA-Tetramethyl benzidine Polyamic Acid

Gel-free polyamic acid was prepared by stoichiometry offset using 12.0 g (50 mmole) TMB and 14.62 g BPDA (1:0.995 stoichiometry) in 170 g NMP and 15 g diglyme, followed by reacting the residual amine end groups with requisite amount of phthalic anhydride.

Free standing fully cured polyimide films with this materialwere formed according to the general procedure as described. Polyimide thickness was 7-8 $\mu$m in 1 coat when spun at 2000 rpm for 45 seconds on silicon wafers. Thicker films were obtained by slower spin speed. Thermal expansion of the BPDA-TMB polyimide film was found to be in the 30-35 ppm deg−1 range. See Table 2.

EXAMPLE 7

Synthesis of BTDA-PDA, and BTDA-Benzidine Polyamic Acids.

These polyamic acids were prepared at 1:1 stoichiometry in NMP solvent with 5% diglyne and at solids content in the range of 12-16%. Essentially gell free material was formed in both cases. The polyimide films derived from these polyamic acids have the thermal expansion and stress-strain properties as indicated in Tables 2 and 3. Dielectric constant of these BTDA derived polyimides was measured to be 3.3 at 10 MHz frequency. BTDA-Benzidine polyimide films were brittle and curled.

By a similar procedure 12.0 g (50 mmole) 2,2',6,6'-tetramethylbenzidine (TMB) and 10.9 g (50 mmole) of PMDA were reacted in 200 g NMP and 10 g diglyme to give a highly gelled polyamic acid. Using an offset stoichiometry (1:0.99) with 12.0 g TMB and 10.8 g PMDA at 11-13% solids in NMP, gel free polyamic acid was formed. The polyimide films formed from this material were found to be quite brittle.

Thermal Expansion Measurements

Coefficient of linear (in-plane) thermal expansion in each case was measured with modified DuPont 943 Thermomechanical Analyzer (TMA). Further details on the experimental procedure for TCE measurements of thin films in general are described in the following references: R. Bruce Prime, chapter 5, pp 498-506 in "Thermal Characterization of polymeric materials", Ed., Edith A. Turi, Academic Press, 1981; R. B. Prime, E. M. Barralt, II, J. A. Logan, P. J. Duke, AIP Conf. Proc. 17, 72-83 (1974); R. Gaskill, E. M. Barralt, II, Thermochim. Acta, 12, 102-104, (1975). Polyimide films were cut into 8 mm long and 3 mm wide strips and mounted on specially designed Invar micro chucks using a template aligner such that the original effective film length remains between 5-5.3 mm for the various samples. Analyses were conducted in air at a heating rate of 5° C./min over a range 25°-150° C. with a 5 gm load applied to prevent the films from twisting or deformation during the run. To obtain the average coefficient of linear thermal expansion at 100° C., dimension change in the original film length was recorded in runs up to 150° C. for three consecutive heating cycles. Of the three runs, the first was generally discarded while data from the subsequent two runs was taken as representative for the film. The TCE values computed in the 75°-125° range were corrected for expansion of Invar (clamps) and quartz (used as hooks) which is 1.6 and 0.55, respectively at 100° C. (data from American Institute of Physics Handbook, 3rd Ed., 1972), and instrument sensitivity calibration factor of 0.9 based on analysis of pure Al foil (TCE at 100° C.=24.5 ppm/°C.) and verification from analysis of Cu foil (TCE at 100° C.=17.5 ppm/°C.).

TABLE 2

THERMAL COEFFICIENT OF EXPANSION (TCE) at 100° C. (Average value in 75-125° range)

| POLYIMIDE | TCE ($\times 10^{-6}$/°C.) | Film Thickness ($\mu$m) used for TCE |
|---|---|---|
| sBPDA-pPDA | 5-6 | 6.5, 9.5 |
| sBPDA-pDABP | 7-9 | 10.5 |
| PMDA-pPDA[a] | 3-4 | 6.0 |
| PMDA-pDABP[b] | 6-7 | 10.5 |
| BTDA-pDABP[b] | 17-18 | 8.0 |
| BTDA-pPDA | 20-22 | 10.5 |
| sBPDA-TMB | 33-35 | 10.1 |
| PMDA-ODA | 33-36 | 7.5, 12.0 |

[a] films are very brittle
[b] films are somewhat brittle and show curling when delaminated from wafers Thermal expansion was also monitored as a function of temperature up to 400° C. This showed no sharp change (or distinct break) in the slope of the plot of dimension change vs temperature. However, in all cases, there was a steady increase in TCE with temperature, e.g. sBPDA-pPDA films showed a TCE of 20 ppm/deg at 325° C., while for BTDA-pPDA polyimide, TCE of 45-50 ppm/deg was observed at the same temperature. This behavior is indicative of the absence of any well defined Tg in these polyimides although TCE in all cases increases with temperature.

TABLE 3

Comparison of Mechanical Properties of Low TCE Polyimides of Examples 1-5

| Polyimide | Elongation-at-break ($E_b$, %) | Elastic Modulus (GPa) | Ultimate Tensile Strength (MPa) |
|---|---|---|---|
| BPDA-PDA | 35-50 | 9-12 | 450-600 |
| BPDA-DABP | 25-30 | 8.5-11 | 450-500 |
| PMDA-PDA* | <10 | 9-10 | 350 |
| BTDA-PDA | 25-30 | 7-8 | 280-300 |
| BTDA-DABP* | <20 | 6-8 | 250 |
| PMDA-ODA+ | 80-85 | 2.7-2.9 | 180-200 |
| BPDA-ODA+ | 77-80 | 3.5-3.8 | 208 |

*These polyimide films were found to be brittle which tend to curl when delaminated from wafers.
+Typical polyimides with non-linear flexible chain segments which are given here for comparison only.

ADHESION ASPECTS OF LOW TCE POLYIMIDES

Fabrication of multilayer metal structures using polyimide insulator generally involves sequential processing such that each subsequent layer is built by first forming polymer coating over the previous fully cured and metallized polyimide layer. In this context, it is well recognized that in the case of high Tg polyimides such as the one derived from PMDA-ODA, there is a problem of polyimide adhesion to 400° C. cured polyimide. We have found that this polyimide-to-polyimide adhesion problem is even more pronounced in the case of low TCE polyimides typically sBPDA-pPDA, sBPDA-Benzidine, PMDA-pPDA, PMDA-Benzidine, and related materials. Since polyimide-to-polyimide and polyimide/metal adhesion and its durability is one of the fundamental requirements for successful use of the low TCE polyimides as interlevel dielectric and passivation layer in microelectronics, it is important that optimum surface modification and processing conditions be specified so as to assure interface integrity at all levels of fabrication and during actual use.

We have discovered that polyimide-to-polyimide adhesion can be improved by controlled surface activation of the first cured layer by $O_2$ plasma or $O_2$ RIE followed by application of gamma-amino propyl triethoxy silane (A1100) as 0.1% solution in aqueous alcohol typically 95:5 ethanol-water mixture, or exposure of the surface activated films to A1100-HMDS (hexamethyldisilazane) in Freon vapor. We have further observed that $O_2$ RIE instead of $O_2$ plasma prior to A1100 application provides superior PI/PI adhesion and also has the advantage of providing better adhesion durability as significantly less degradation (10-15%) of adhesion is observed when exposed to 85° C./81% relative humidity conditions than is observed with $O_2$ plasma treated surfaces (40-50% decrease) under similar conditions for 300 hrs.

EXAMPLE 8

Polyimide Adhesion to fully cured polyimide Effect of surface activation of cured film Precleaned silicon wafers or ceramic substrates were primed with adhesion promoter typically a silane coupling agents such as A1100, and BPDA-PDA polyamic acid of examples 1 or 2 was spin applied followed by bake/cure up to 350°-400° C. in inert or reducing ambient. Surface activation of this fully cured film was achieved by subjecting to $O_2$ RIE for 2-5 min at 100-200 watts, 50-300 mTorr pressure, and 50 sccm gas flow, such that 1000-2000 Å surface film is removed. This was followed by spin application of A1100 (0.1% solution in 95:5 ethanol-water) at 2000 rpm/2 min, (and drying at 85° C. for 5-10 min as an optional process step) followed by a second layer of polyimide and curing up to 350°-400° C. with initial low temperature bake/cure as 80°-90°/45 min, 130-150/45 min, 230°/45 min, all in nitrogen, 300°/30 min in forming gas, prior to the final 350° or 400° for 60 min in forming gas, to obtain 10-12 μm thick cured top layer. Peel adhesion measurement according to the standard 90° Peel test using tensile tester (Instron Model 1122) gave >80-90 g/mm peel strength for separating top layer from the first polyimide layer. In each case, ⅛" or ¼" wide strips were scribed with a sharp scalpel using a precision guide such that smooth edged strips of defined width were formed. Similar adhesion studies with other polyimides both in low TCE category and those having flexible chain segments typically PMDA-ODA, show that $O_2$ RIE instead of plasma in general provides improved PI/PI adhesion and its durability when exposed to thermal cycling and repetitive temperature/humidity excursions. No change in adhesion was observed when samples were subjected to prolonged 400° exposure in inert ambient, thermal excursions from 25° to 400° C., or storage in ambient temperature and humidity for extended periods. Exposure of these films to 85° C./81% relative humidity for 300 hours showed 10-15% decrease in adhesion when $O_2$ RIE activation was used and 30-40% decrease with $O_2$ plasma activation.

TABLE 4

Comparison of Polyimide-to-polyimide Peel Adhesion Values vs Surface Activation Conditions for the first fully cured polyimide layers:

| | Peel Adhesion (g/mm)* | |
|---|---|---|
| Surface Treatment of the first layer | BPDA-PDA (11 μm) on BPDA-PDA | PMDA-ODA (22 μm) on PMDA-ODA |
| None | No Adhesion | No Adhesion |
| A1100 only | 10 | 10 |
| 5' $O_2$ Plasma only** | 35-45 | 45-50 |
| 5' $O_2$ Plasma/A1100*** | 60-65 | 57-68 |
| $O_2$ RIE/A1100 | 80-90 | 70-80 |
| $O_2$ plasma/A1100-HMDS in Freon vapor | 70 | — |

*At the start of the peel, cross-head speed of 0.5 mm/min was used which was then increased to 2-5 mm/min as the peeling progressed.
**Longer exposure to oxygen plasma results in somewhat increased adhesion.
***$O_2$ plasma/A1100 application followed by 85° C. bake/5-10 min. prior to second layer of polymer gave slightly improved peel values.

The new method of surface modification to improve polyimide adhesion to fully cured polyimide according to this invention provides solution to the adhesion problem with low TCE polyimides in particular and for other classes of high Tg polyimides in general.

Characterization of modified surfaces by X-ray photoelectron spectroscopy (XPS) show significant differences in the chemistry of plasma vs RIE activated surfaces in terms of the nature and distribution of the oxidized carbon functionality as well as in the bonding state of carbon and nitrogen, In general, the effect of surface activation is decrease in non-functionalized carbon signal at 185.0 ev and increase in oxygen-bonded carbons at higher binding energies and increase in oxygen signal at 532 and 533.7 ev binding energies.

TABLE 5

XPS Analysis/Surface Composition (Atom %) of 400° cured BPDA-PDA Polyimide films before and after surface modification: Data from Deconvoluted Spectra

| | BE. | Polyimide Surface Activation | | | |
|---|---|---|---|---|---|
| Element | (eV) | None | Theory* | $O_2$ Plasma | $O_2$ RIE |
| C1s | 285.0 | 70.8 | (64.28) | 28.9 | 44.6 |
| C1s | 286.5 | | | 5.4 | 12.4 |
| C1s | 287.3 | | | 6.8 | |
| C1s | 288.6 | 10.1 | (14.28) | 6.2 | 15.6 |
| C1s | 289.8 | | | 6.5 | |
| N1s | 400.5 | 6.8 | (7.14) | 5.7 | 4.7 |
| N1s | 401.8 | | | 1.6 | |
| N1s | 399.2 | | | | 1.4 |
| O1s | 532.2 | 11.2 | (14.28) | 20.0 | 14.1 |
| O1s | 533.7 | 1.0 | | 8.8 | 7.2 |

BE=Binding Energy in electron volts: 285.0 eV is ascribed to the 18 non-functionalized carbons (aromatic carbons not attached to electronegative atoms) of BPDA-PDA, 288.6 eV to —C=O imide carbons, imide nitrogen at 400.5 eV, carbonyl oxygen at 532.2 eV. The new carbon and oxygen peaks observed in the activated surface spectra can be attributed to the formation of alcohol, ether, ester, hydroperoxide, carboxylic acid functional groups. Literature on the assignment of various peaks can be found in "Practical Surface Analysis", Eds., D. Briggs and M. P. Seah, John Wiley and Sons Ltd., 1983, chapter 9, pp 359-396.

*These are calculated values based on the BPDA-PDA repeat unit in polyimide bulk composition

TABLE 6

Elemental Composition (Atom %) From XPS Survey Scan of BPDA-PDA Polyimide before and after Activation

| | BPDA-PDA Polyimide Surface Composition | | | |
|---|---|---|---|---|
| Element | From ESCA | Theory | After $O_2$ plasma | After $O_2$ RIE |
| $C_{1s}$ | 78.4% | 78.56 | 64.3 | 72.5 |
| $N_{1s}$ | 7.1% | 7.14 | 6.6 | 5.2 |
| $O_{1s}$ | 14.5% | 14.28 | 29.1 | 22.3 |

Cu foil or sputter deposited or E-beam evaporated Cu on a substrate was surface cleaned by $Ar^+$ bombardment and modified by treating with silane coupling agent in aqueous alcoholic solution or by 5 min exposure to A1100-HMDS (hexamethyldisilazane) in Freon vapor. The surface treated Cu was immediately overcoated with BPDA-PDA polyamic acid which was subjected to bake/cure cycle as follows: 80°–85° C./45 min in a $N_2$ purged oven, 130°/30 min ($N_2$), 230°/45 min ($N_2$), then at 300°/30 min and 350°–400°/45 min in a forming gas (8–10% $H_2$ in $N_2$) purged furnace. At no stage of the curing cycle, the films were allowed to be exposed to air when they were still hot. When transferring from one oven or furnace to another, the substrate were brought to at least 85° C. while still in inert atmosphere before removing. When processed under these conditions, no detriment to Cu/polyimide interface was observed in the high temperature cure or temperature/humidity cycling. Mechanical properties of the polyimide films cured on Cu were found to be essentially the same as those of films cured on silicon wafers. Also, the dielectric constant of films cured on Cu was determined by forming thin film of BPDA-PDA and other rigid-rod polyimide films on Cu as the bottom electrode. The films were cured as described above with the precaution that inert/reducing ambient was assured during bake/cure cycle. This was followed by deposition of Cu dots or Al/Cu dots through a mask to form the top electrode. Capacitance measurements showed that the dielectric constant remains essentially unchanged in comparison to the measurements made with the films cured on Al/Cu, which is 2.9 at 10 MHz and 3.0 −3.1 at 100 KHz.

In a similar manner Cr, Ti, Sn and Sn/Au metallurgy may be surface treated and have a more adherent layer of polyamic acid applied to such surfaces. That polyamic acid is then cured to polyimide.

We claim:

1. An improved polyamic acid composition comprising the viscosity-stable essentially gel-free reaction product N-methyl-2-pyrrolidone as a solvent with a stoichiometry of 100 mole parts of a linear aromatic diamine with from 97 to 99.5 mole parts of an aromatic dianhydride and a sufficient amount of an aromatic anhydride to react with the residual amine sites and stabilize the composition.

2. The polyamic acid composition of claim 1 wherein the aromatic diamine is selected from the group consisting of p-phenylene diamine, 4,4'diaminobiphenyl, 2,2'ditrifluoromethyl-4,4'diaminobiphenyl, 4,4''-diaminoterphenyl, ditrifluoromethyl-4,4''-diaminoterphenyl, 3,3'-dimethyl-4,4'-diaminobiphenyl and 3,3',5,5'-tetramethyl-4,4'-diaminobiphenyl.

3. The polyamic acid composition of claim 1 wherein the aromatic dianhydride is selected from the group consisting of pyromellitic dianhydride and 3,3',4,4'-biphenyltetracarboxylic dianhydride.

4. The polyamic acid composition of claim 1 wherein the aromatic anhydride is phthalic anhydride or a substituted phthalic anhydride.

5. The polyamic acid composition of claim 1 wherein the weight average molecular weight is in the range from 20,000 to 50,000.

6. The polyamic acid composition of claim 1 which further comprises N-methyl-2-pyrrolidone as a solvent and which comprises from about 9 to about 20%.

7. The polyamic acid composition of claim 1 which comprises the reaction product of 100 mole parts p-phenylene diamine and 98.5 mole parts of 3,3',4,4'biphenyltetracarboxylic dianhydride.

8. The polyamic acid composition of claim 7 which has intrinsic viscosity in NMP at 25° C. in the range 1.1–1.5 dl/gm, a weight average molecular weight of from 25,000 to 37,000, a solution viscosity of from 2200 to 3000 centistokes and which contains from about 10.5% to about 12.5% solids.

9. The polyamic acid composition of claim 1 which comprises 100 mole parts phenylene diamine, from 98.8 to 99.5 mole parts of 3,3',4,4'-biphenyltetracarboxylic dianhydride.

10. The polyamic acid composition of claim 9 which has instrinsic viscosity in NMP at 25° C. in the range 1.1–1.7 dl/gm, a weight average molecular weight from about 32,000 to about 50,000, a solution viscosity of from about 29,000 to about 40,000 centistokes and which has from about 13.5% to about 15.5% solids.

11. The polyimide formed from the thermal curing of the polyamic acid of claim 1.

12. The polyimide of claim 11 having a glass transition temperature (Tg) of at least about 390° C.

13. The polyimide of claim 11 wherein the coefficient of thermal expansion is from about 3 to about 10 parts per million per degree at 100° C.

* * * * *

UNITED STATES PATENT AND TRADEMARK OFFICE
CERTIFICATE OF CORRECTION

PATENT NO. : 5,115,090

DATED : May 19, 1992

INVENTOR(S) : K. G. Sachdev, J.P. Hummel, R. W. Kwong, R. N. Lang, L. L. Linehan, and H. S. Sachdev It is certified that error appears in the above-indentified patent and that said Letters Patent is hereby corrected as shown below:

At Column 14, claim 6, please correct the claim to read:

-- 6. The polyamic acid composition of claim 1 which comprises from about 9 to about 20% solids.--

Signed and Sealed this

Nineteenth Day of April, 1994

Attest:

BRUCE LEHMAN

*Attesting Officer*   Commissioner of Patents and Trademarks